United States Patent
Kunii et al.

[19]

[11] Patent Number: 5,883,407
[45] Date of Patent: Mar. 16, 1999

[54] SEMICONDUCTOR DEVICE

[75] Inventors: Tetsuo Kunii; Naohito Yoshida, both of Tokyo, Japan

[73] Assignee: Mitsubishi Denki Kabushiki Kaisha, Tokyo, Japan

[21] Appl. No.: 872,920

[22] Filed: Jun. 11, 1997

[30] Foreign Application Priority Data

Feb. 21, 1997 [JP] Japan .................................. 9-037544

[51] Int. Cl.⁶ .................................................. H01L 29/80
[52] U.S. Cl. ........................ 257/275; 257/276; 257/277; 257/287
[58] Field of Search ..................................... 257/275, 276, 257/277, 287, 289, 734

[56] References Cited

U.S. PATENT DOCUMENTS

| | | | |
|---|---|---|---|
| 3,969,745 | 7/1976 | Blocker, III ............................... | 257/276 |
| 4,104,672 | 8/1978 | DiLorenzo et al. ........................ | 357/22 |
| 4,104,673 | 8/1978 | Dickens ...................................... | 357/22 |
| 4,380,022 | 4/1983 | Yoder ......................................... | 357/22 |
| 4,871,687 | 10/1989 | Donzelli ..................................... | 437/40 |
| 4,891,686 | 1/1990 | Krausse, III ............................... | 357/68 |
| 5,023,677 | 6/1991 | Truitt ......................................... | 357/22 |
| 5,283,452 | 2/1994 | Shih et al. ................................. | 257/277 |
| 5,633,517 | 5/1997 | Saitoh ....................................... | 257/277 |

FOREIGN PATENT DOCUMENTS

| | | |
|---|---|---|
| 196965 | 1/1989 | Japan . |
| 8274116 | 8/1996 | Japan . |

*Primary Examiner*—Sara Crane
*Attorney, Agent, or Firm*—Leydig, Voit & Mayer

[57] ABSTRACT

A semiconductor device includes a semiconductor substrate having an active region and first and second external regions located on opposite sides of the active region. The active region has a multi-finger pattern including gate electrodes, source electrodes, and drain electrodes. Each of the gate electrodes is interposed between one of the source electrodes and one of the drain electrodes. Mutually spaced gate pads are disposed on the first external region and each of the gate pads is connected to the gate electrodes. Mutually spaced drain pads are disposed on the second external region, and each of the drain pads is connected to the drain electrodes. Mutually spaced and grounded source pads are disposed on the first and second external regions, and each of the source pads is electrically connected to the source electrodes. Because the source pads are located on both the gate pad side and the drain pad side, the number of source pads having vias can be increased without changing the size of the source pads and the gate pads, reducing the number of source electrodes connected to one via.

8 Claims, 10 Drawing Sheets

SEMICONDUCTOR DEVICE

BACKGROUND OF THE INVENTION

1. Field of the Invention

SEMICONDUCTOR DEVICE

The present invention relates generally to a high-output power semiconductor device and, more particularly, to a high-output FET with reduced source inductance.

2. Description of Related Art

FIG. 9 is a plan view showing a high-output FET of a conventional structure provided with, between gate pads 6, source pads 6 which are connected to a grounded heat sink plating 12 on the back side with vias 8 formed therein. FIG. 10 is a cross sectional view in taken along line X—X of FIG. 9.

In the drawings, numeral 1 denotes gate fingers (gate electrodes), 2 denotes drain electrodes, 3 denotes source electrodes, 4 denotes gate pads, 5 denotes drain pads, 6 denotes source pads, 7 denotes source air bridge wirings, 8 denotes vias, 9 denotes gate feeders, 10 denotes a drain feeder, 11 denotes a semi-insulating GaAs substrate, 12 denotes the heat sink plating on the back side, 13 denotes an ohmic metal (source), 14 denotes a wiring metal, 15 denotes a wiring metal for the source pad and 18 denotes a wiring metal for the drain pad. The source pads 6 and the gate pads 4 are usually arranged along the same edge of the active region (upper edge in FIG. 9) wherein the gate electrodes 1, drain electrodes 2, the source electrodes 3 and other elements are formed.

In order to obtain a high gain ($Ga_{max}$) with a high-output FET of such a structure, it is important to reduce the value of Ls (source inductance). It is a common practice to employ a structure having a plurality of source pads 6 with vias 8 being connected thereto as shown in FIG. 9, thereby reducing the number of source electrodes 3 connected to a single via.

That is, FIG. 9 shows a structure with between the gate pads 4, the source pads 6, to which source electrodes 3 that correspond to 14 gate fingers 2 are connected, while each of the source electrodes 3 is connected to the via 8 to be grounded. Connection between the source electrode 3 and the source pad 6 where the via 8 is located is achieved by the air bridge wiring 7 which crosses over the gate feeder 9 as shown in the cross sectional view of FIG. 10.

In the case where the high-output FET is used at a high-frequency region, it is necessary to further reduce the number of source electrodes 3 connected to one via 8 (increase the number of vias 8 per unit gate width) to reduce the value of Ls, as compared with the case where the high-output FET is used at an ordinary frequency region. However, because the minimum size of the gate pads 1 is restricted by the process of assembly and that of the source pads 6 is restricted by the process of forming the vias, there is a certain limit to increasing the number of source pads and the number of vias 8 connected thereto by making the gate pads 1 and the source pads 6 small.

SUMMARY OF THE INVENTION

The present invention has been developed to overcome the above-described disadvantages.

It is accordingly an objective of the present invention to provide a high-output FET with reduced Ls and high gain, by reducing the number of source electrodes connected to one via without changing the sizes of source pads and gate pads.

The inventors of the present application have found out that the number of source pads having vias defined therein can be increased by forming the source pads on both the gate pad side and the drain pad side without changing the size of the source pads and the gate pads, thereby reducing the number of source electrodes connected to one via and reducing the value of Ls.

In accomplishing the above and other objectives, a semiconductor device according to the present invention comprises a GaAs substrate having an active region and first and second external regions on opposite sides of the active region. The active region has a multi-finger pattern made up of a plurality of gate electrodes, a plurality of source electrodes, and a plurality of drain electrodes. Each of the plurality of gate electrodes is interposed between one of the plurality of source electrodes and one of the plurality of drain electrodes. A plurality of gate pads spaced apart from one another are disposed on the first external region, and each of them is connected to the plurality of gate electrodes. A plurality of drain pads spaced apart from one another are disposed on the second external region, and each of them is connected to the plurality of drain electrodes. A plurality of grounded source pads spaced apart from one another are disposed on the first and second external regions, and each of them is electrically connected to the plurality of source electrodes.

In the above-described construction, it is made possible to increase the number of source pads on the semiconductor device because the source pads are also located on the drain pad side in the air-bridge structure crossing over the wiring that connects to the drain electrode, resulting in an increased number of vias which are connected to the ground electrodes on the back side for each source pad, thereby making it possible to reduce the source inductance (Ls) and increase the maximum power gain (Gamax) of the semiconductor device.

Advantageously, the plurality of gate pads are disposed outside the plurality of source pads, and each of them is connected to the plurality of gate electrodes via a first wiring interposed between two neighboring source pads. The plurality of drain pads are disposed outside the plurality of source pads, and each of them is connected to the plurality of drain electrodes via a second wiring interposed between two neighboring source pads.

This construction can reduce the space between neighboring source pads to densely form the source pads. As a result, it is possible to increase the number of source pads to be formed on the semiconductor device, thereby reducing the value of Ls and increasing the maximum power gain (Gamax).

The plurality of gate pads may be connected to one another on the first external region, while the plurality of drain pads may be connected to one another on the second external region.

By so doing, it becomes possible to increase the total area of the gate pads and that of the drain pads and, hence, the number of bonding wires required to connect the semiconductor device to external electrodes can be increased, thereby reducing the parasitic inductance of the bonding wires.

It is preferred that the plurality of gate pads be electrically insulated by a plurality of resistor regions. When the gate pads have an integrated structure, there is a good chance that loop oscillation may take place in gate input signals. This loop oscillation can be suppressed by electrically separating the first wirings from one another by means of the resistor regions.

Each of the plurality of gate pads may be disposed between two neighboring source pads, while each of the plurality of drain pads may be disposed between two neighboring source pads. In this case, it is preferred that each of the plurality of source electrodes be generally straight.

In the conventional construction, because the source pads are not always formed on extensions of the source electrodes, the source electrodes are connected to the source pads by bending some of the source electrodes. On the other hand, according to the present invention, because the generally straight source electrodes are connected to the source pads, it becomes possible to eliminate variations in Ls which have hitherto been caused by different lengths of the source electrodes. Also, it becomes possible to obtain drain output signals substantially constant in phase, because the lengths of current paths do not differ according to the source electrodes before gate input signals are output from the drains.

Each of the plurality of gate pads may be connected via a plurality of first wirings to a second wiring that is disposed on the first external region and is connected to the plurality of gate electrodes so that wiring lengths from each of the plurality of gate electrodes to the second wiring are substantially constant.

By so doing, drain output signals substantially constant in phase can be also obtained.

In another form of the present invention, the semiconductor device comprises a plurality of gate pads disposed on the first external region and spaced apart from one another, a plurality of drain pads disposed on the second external region and spaced apart from one another, a plurality of stub adjustment regions each interposed between two neighboring gate pads, and a plurality of grounded source pads disposed on at least one of the first and second external regions so that each of the plurality of grounded source pads is interposed between two neighboring gate pads or two neighboring drain pads.

By this construction, because the source pads which have hitherto been disposed on the side of the gate pads are shifted to the drain pad side, the stub adjustment regions having matching means for gate signals can be formed on areas where the source pads have hitherto been formed. Accordingly, the stub adjustment regions which have hitherto been provided outside the semiconductor device can be formed in the vicinity of the gate pads, thus facilitating the matching of the gate signals.

BRIEF DESCRIPTION OF THE DRAWINGS

The above and other objectives and features of the present invention will become more apparent from the following description of preferred embodiments with reference to the accompanying drawings, throughout which like parts are designated by like reference numerals, and wherein.

DETAILED DESCRIPTION OF THE PREFERRED EMBODIMENTS

This application is based on application No. 9-37544 filed in Japan, the content of which is incorporated hereinto by reference.

Embodiment 1

Figure 1:
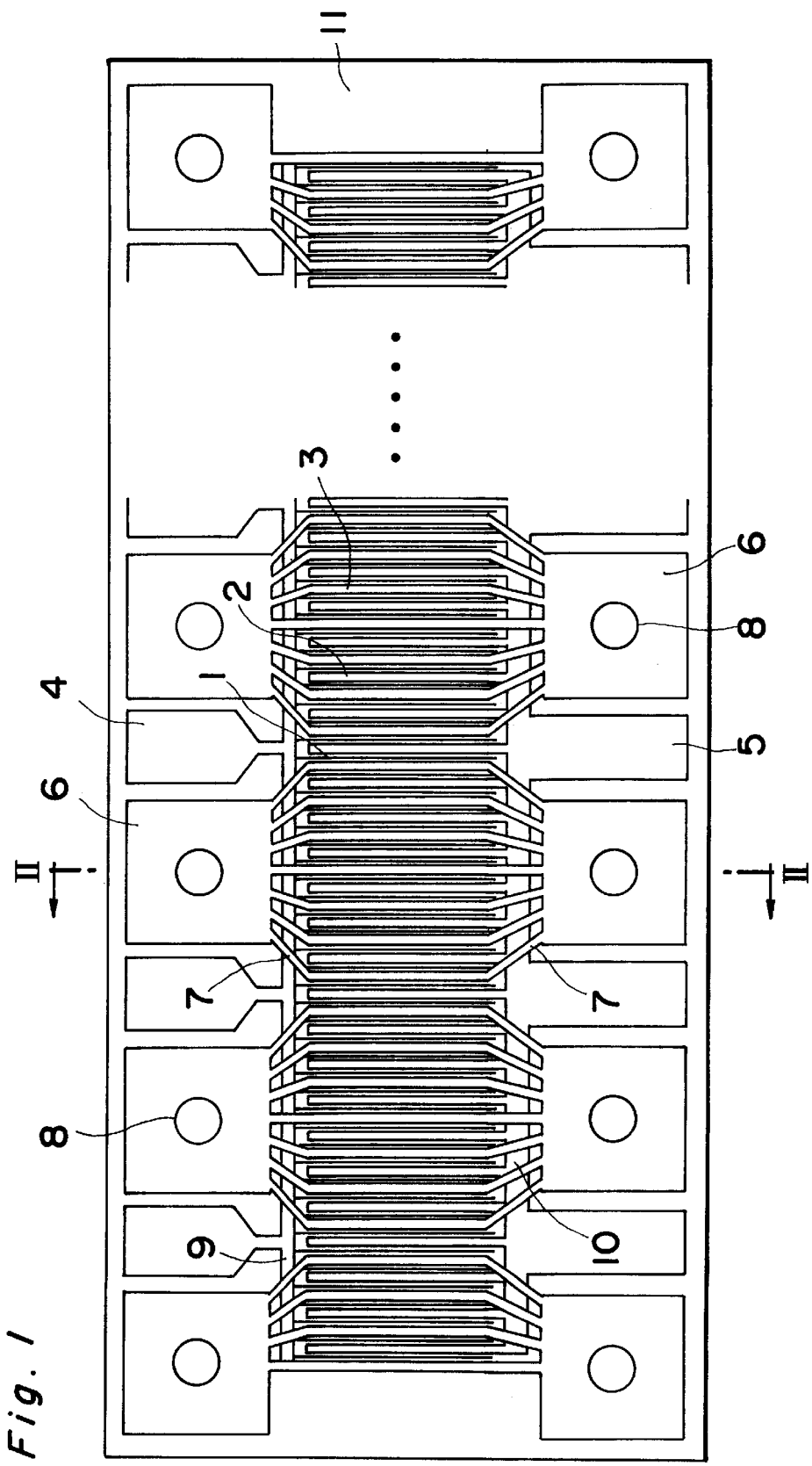
FIG. 1 is a plan view showing a semiconductor device according to a first embodiment of the present invention.
Figure 2:
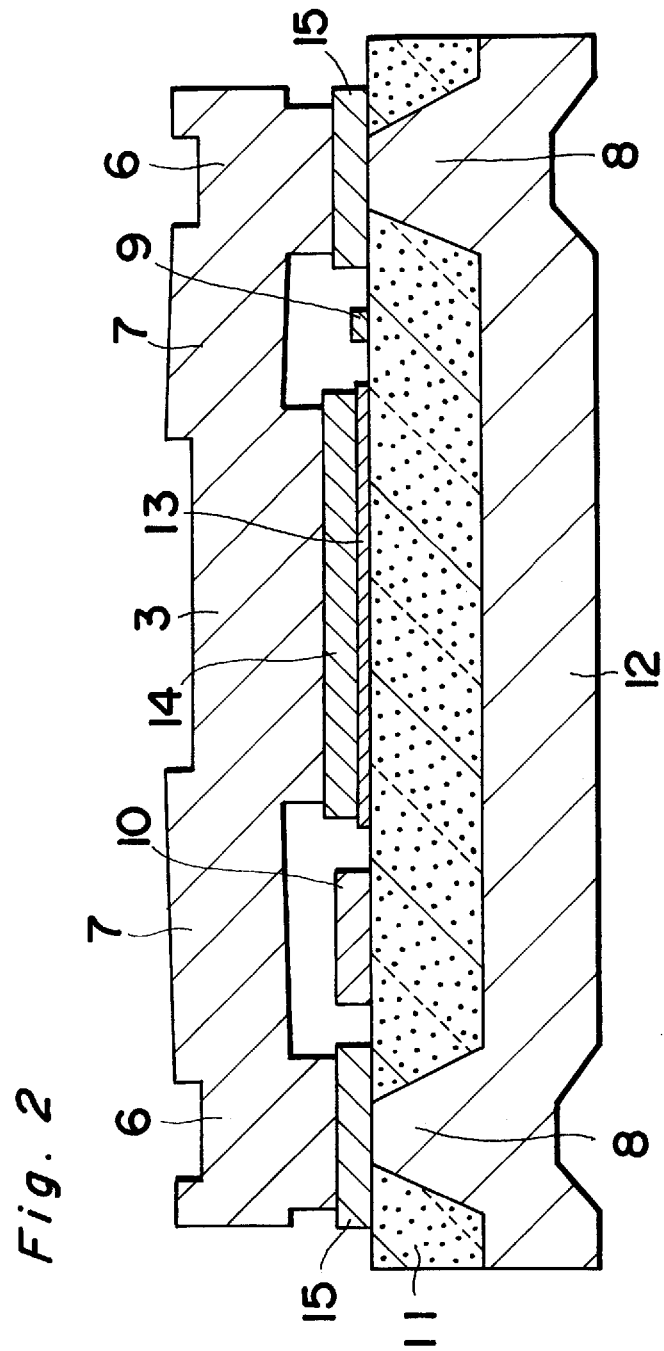
FIG. 2 is a cross sectional view taken along line II—II in FIG. 1.

FIGS. 1 and 2 show a plan view and a cross sectional view, respectively, of a semiconductor device according to a first embodiment of the present invention.

As shown in FIG. 1, source pads 6, having vias 8 therein for the reduction of Ls, are located both between the gate pads 4 and between the drain pads 5. FIG. 2 is a cross sectional view in taken along line II—II of FIG. 1. In the drawings, numeral 1 denotes gate fingers (gate electrodes), 2 denotes drain electrodes, 3 denotes source electrodes, 4 denotes gate pads, 5 denotes drain pads, 6 denotes source pads, 7 denotes source air bridge wirings, 8 denotes vias, 9 denotes a gate feeder, 10 denotes a drain feeder, 11 denotes a semi-insulating GaAs substrate, 12 denotes a heat sink plating on the back side of the substrate, 13 denotes an ohmic metal (source), 14 denotes a wiring metal and 15 denotes a wiring metal for the source pads. The plurality of gate electrodes 1, the plurality of source electrodes 3, and the plurality of drain electrodes 2 make up a multi-finger pattern.

Figure 9:
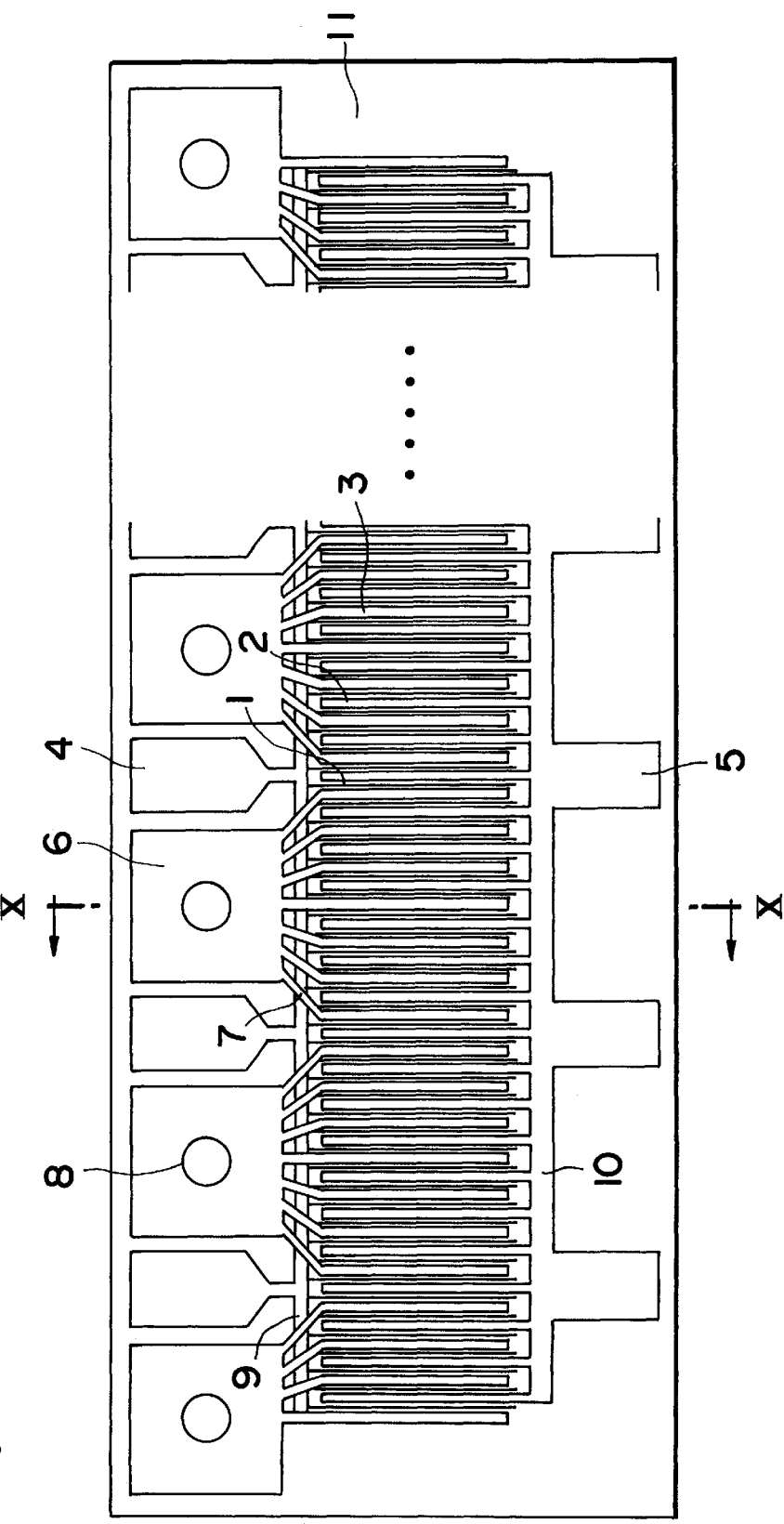
FIG. 9 is a plan view showing a conventional semiconductor device.

In the case of the FET of a conventional structure shown in FIG. 9, maximum available power gain (Gamax) is generally be represented by equation 1 in terms of equivalent circuit parameters.

$$Ga_{max} = \frac{(f_T/f)^2}{4C_{gs}(R_i + R_s + R_g + (W_T L_s/2)) + 2W_T C_{gd}(R_i + R_s + 2R_g + W_T L_s)}$$

Thus it is an object of this embodiment to increase the maximum available power gain (Gamax) by reducing the value of Ls (source inductance) in this equation.

That is, this embodiment is characterized in that the gate pads 4, the source pads 6 and the vias 8 in the upper portion of the plan view of FIG. 1 are arranged to have dimensions similar to those of the semiconductor device of the prior art, while the source pads 6 and the vias 8 are located also between drain pads 5 in the lower portion of FIG. 1 in such a way that the source pad 6 on this side opposes the source pad 6 on the other side with the active region between the source pads.

Connection from each source electrode to the source pad 6 located between the gate pads 4 is also achieved by the Au-plated air bridge wiring 7 which crosses over the gate feeder 9 as shown in FIG. 2, similarly to the prior art.

Similarly, connection to the source pad 6 located between the drain pads 5 is also achieved by the Au-plated air bridge wiring 7 which crosses over the drain feeder 10 as shown in FIG. 2.

Figure 10:
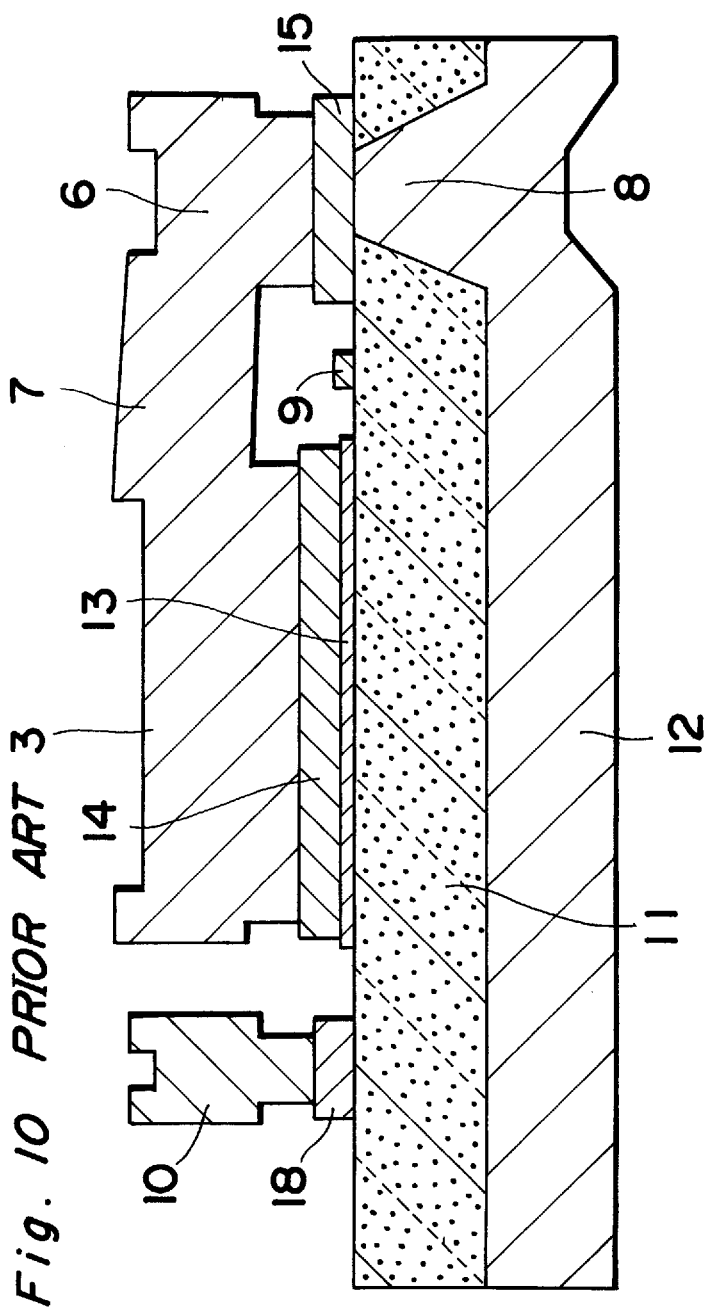
FIG. 10 is a cross sectional view taken along line X—X in FIG. 9.

The FET of the conventional structure shown in FIGS. 9 and 10 has Au plated layers on the drain electrodes 7 and the drain feeder 10 for reduction of the resistance of the drain electrodes 7 and the drain feeder 10, while in this embodiment the source air bridge 7 crosses over the drain feeder 10 and therefore it is not necessary to make the drain feeder 10 only of a wiring metal without forming a plating layer thereon.

Accordingly, what is important here is whether the drain feeder 10 which has no Au plating layer has a sufficient cross sectional area to sustain the current density flowing therein. MIL-STD (MIL-M-38510H) specifies that the current density in an Au plated portion of a semiconductor device be restricted to no more than $6 \times 10^5$ A/cm². Assuming 300 mA/mm for the current density flowing in the FET during normal operation, 300 μm for maximum unit gate width and 14 unit gates, leads to 630 mA of maximum current drawn through the drain feeder 10. This means that the current density can be limited within $6 \times 10^5$ A/cm² by providing the drain feeder 10 with Au plating 2 μm in thickness and 60 μm in width.

Accordingly in this embodiment, the drain feeder 10 is formed in such a way that the current density therein is within $6 \times 10^5$ A/cm², thereby making it unnecessary to form the plating layer which is formed on the drain feeder 10 in the prior art, while forming the source pad 6 between the gate pads 5 by crossing over the drain feeder 10 with the air bridge 7.

By employing such a structure as described above, both the number of source electrodes connected to a via and the value of Ls can be reduced to half of those in the semiconductor device of the prior art, thereby making it possible to achieve a higher gain of the high-output FET (increase Gamax) during operation at high frequencies:

Embodiment 2

Figure 3:
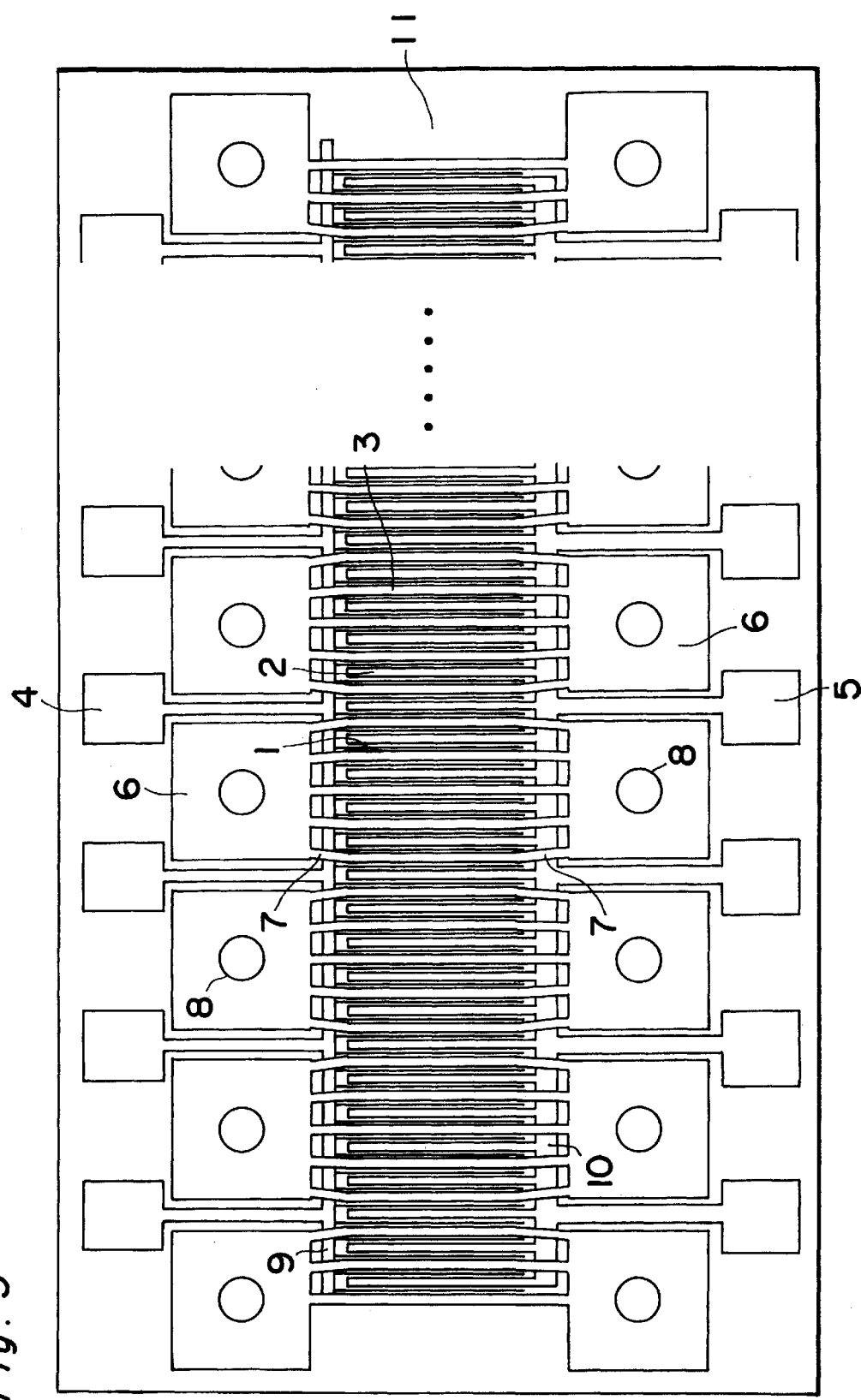
FIG. 3 is a plan view showing a semiconductor device according to a second embodiment of the present invention.

FIG. 3 is a plan view of a high-output FET according to the second embodiment which is a higher performance version of the first embodiment of the present invention. The semiconductor device of this embodiment is characterized in that the source pads 6 and the vias 8 are located on both the gate pad 4 side and the drain pad 5 side of the active region, in order to reduce the value of Ls, and the gate pads 4 and the drain pads 5 are formed outside the source pad. In the drawing, numerals identical to those of FIG. 1 denote identical or corresponding parts.

In this embodiment, similarly to the first embodiment, the source pads 6 and the vias 8 are located on both the gate pad 4 side and the drain pad 5 side opposite each other with the active region between them, and the drain feeder 10 is formed only of wiring metal without plating.

A characteristic feature of this embodiment is that the gate pads 4 and the drain pads 5 are led beyond the source pad to reduce the spacing between the source pads and to form the source pads 6 more densely, so that the numbers of the source pads 6 and the vias 8 can be increased and the number of source electrodes 3 connected to one via can be decreased.

Thus a width similar to that of the gate feeder 9 (about 100 μm) would be sufficient for the wiring which connects the gate feeders 9 and the gate pads 4, even when the current density is taken into consideration, and the wiring which connects the drain feeder 10 and the drain pads 5 can be increased in thickness by means of Au-plating on the wiring metal so that it can be made narrower than the gate feeder 9 (about 30 μm). Therefore, the spacing between the source pads 6 can be reduced as shown in FIG. 3 thereby making it possible to increase the number of source pads 6 which are connected to the vias 8.

In the semiconductor device according to this embodiment, similarly to the first embodiment, the number of the source pads 6 to which the vias 8 are connected can be increased to twice that in the case of the conventional semiconductor device by providing the vias 8 also on the drain side, while at the same time number of the source pads 6 to which the vias 8 are connected can be increased further compared to the first embodiment by leading the gate pads 4 and the drain pads 5 to the outside of the source pads 6. Thus it is made possible to reduce the value of Ls to one half that of the semiconductor device of the prior art or lower, thereby achieving a higher gain of the high-output FET during operation at high frequencies.

Embodiment 3

Figure 4:
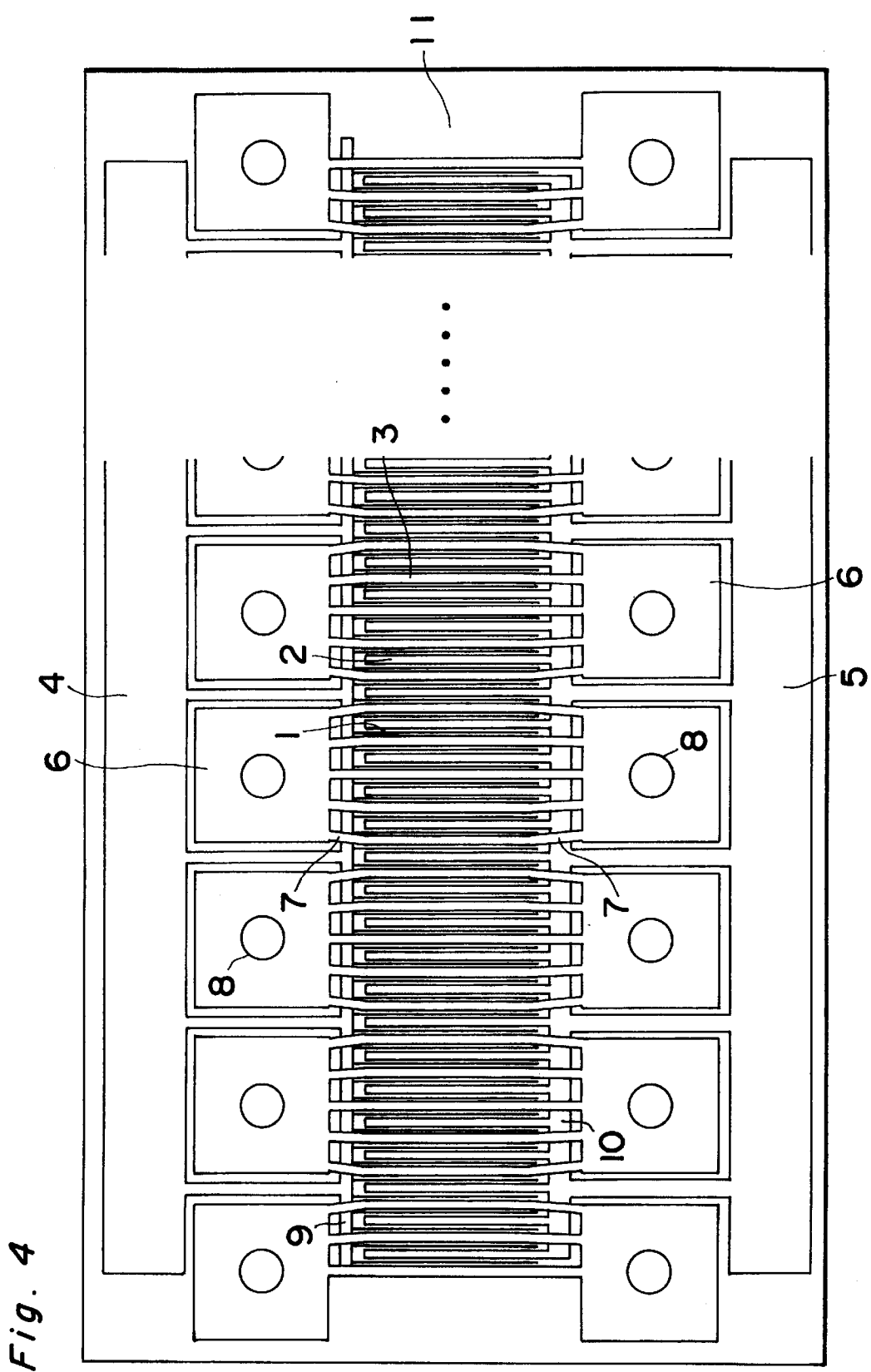
FIG. 4 is a plan view showing a semiconductor device according to a third embodiment of the present invention.

FIG. 4 is a plan view of a semiconductor device according to the third embodiment which is a further advanced version of the second embodiment of the present invention for higher performance. Numerals identical to those of FIG. 1 denote identical or corresponding parts.

The semiconductor device of the third embodiment is characterized in that the source pads 6 and the vias 8 are located on both the gate pad side and the drain pad side in order to reduce the value of Ls, while the gate pads 4 and the drain pads 5 are located beyond the source pads, and the gate pads and the drain pads are integrated as a single electrode. In FIG. 4, the gate pads 4 and the drain pads 5 are integrated as single electrode, but they may be integrated as a plurality of electrodes.

In this embodiment, in addition to having a basic structure similar to the second embodiment, the gate pads and the drain pads are integrated as a single electrode. Thus, it is possible, in addition to the effect of reducing the value of Ls similarly to that of the second embodiment, to provide dense connections of outside-connecting bonding wires, which have previously been capable of only connecting the gate pad or drain pad individually, to the pads each having a wider area due to integration. This enables reduction in the inductance of the bonding wire, resulting in the reduction of inductance of the semiconductor as a whole, thereby improving the maximum power gain (Gamax) and achieving further higher performance of the high-output FET.

Embodiment 4

Figure 5:
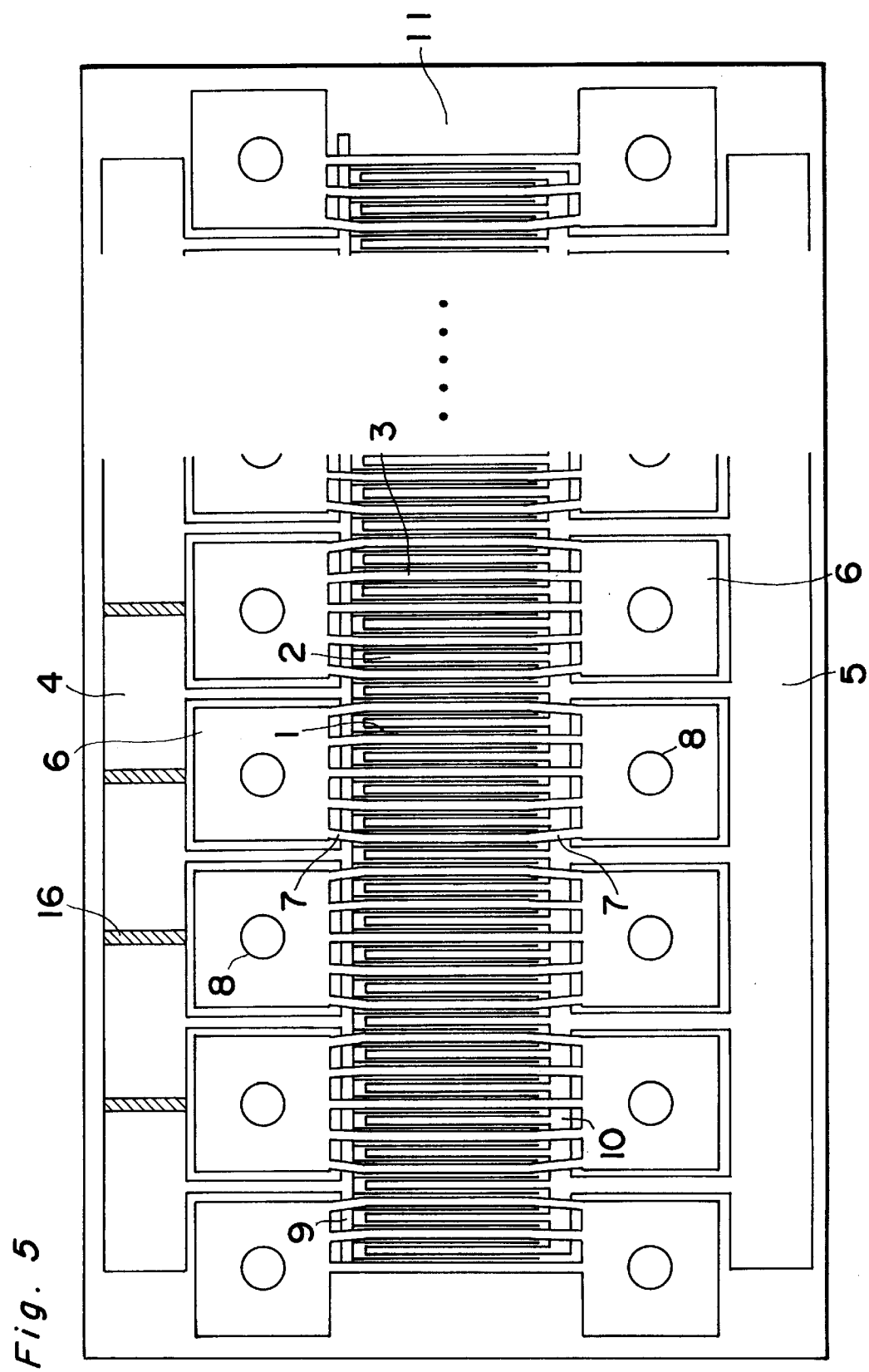
FIG. 5 is a plan view showing a semiconductor device according to a fourth embodiment of the present invention.

FIG. 5 is a plan view of a semiconductor device according to the fourth embodiment which is a further advanced version of the third embodiment of the present invention for higher performance. In the drawings, numerals identical to those of FIG. 1 denote identical or corresponding parts.

In the semiconductor device of the fourth embodiment, in addition to having a basic structure similar to that of the third embodiment, the gate pad which is integrated as described in the third embodiment is electrically separated or insulated by means of a plurality of resistor regions 16.

The fourth embodiment of such a structure is, in addition to having an effect of increasing the number of bonding wires and thereby decreasing the parasitic inductance of the bonding wires similarly to the third embodiment, capable of suppressing loop oscillation taking place when RF input signal is fed through the gate, because the integrated gate pad 4 is formed while being electrically insulated.

Embodiment 5

Figure 6:
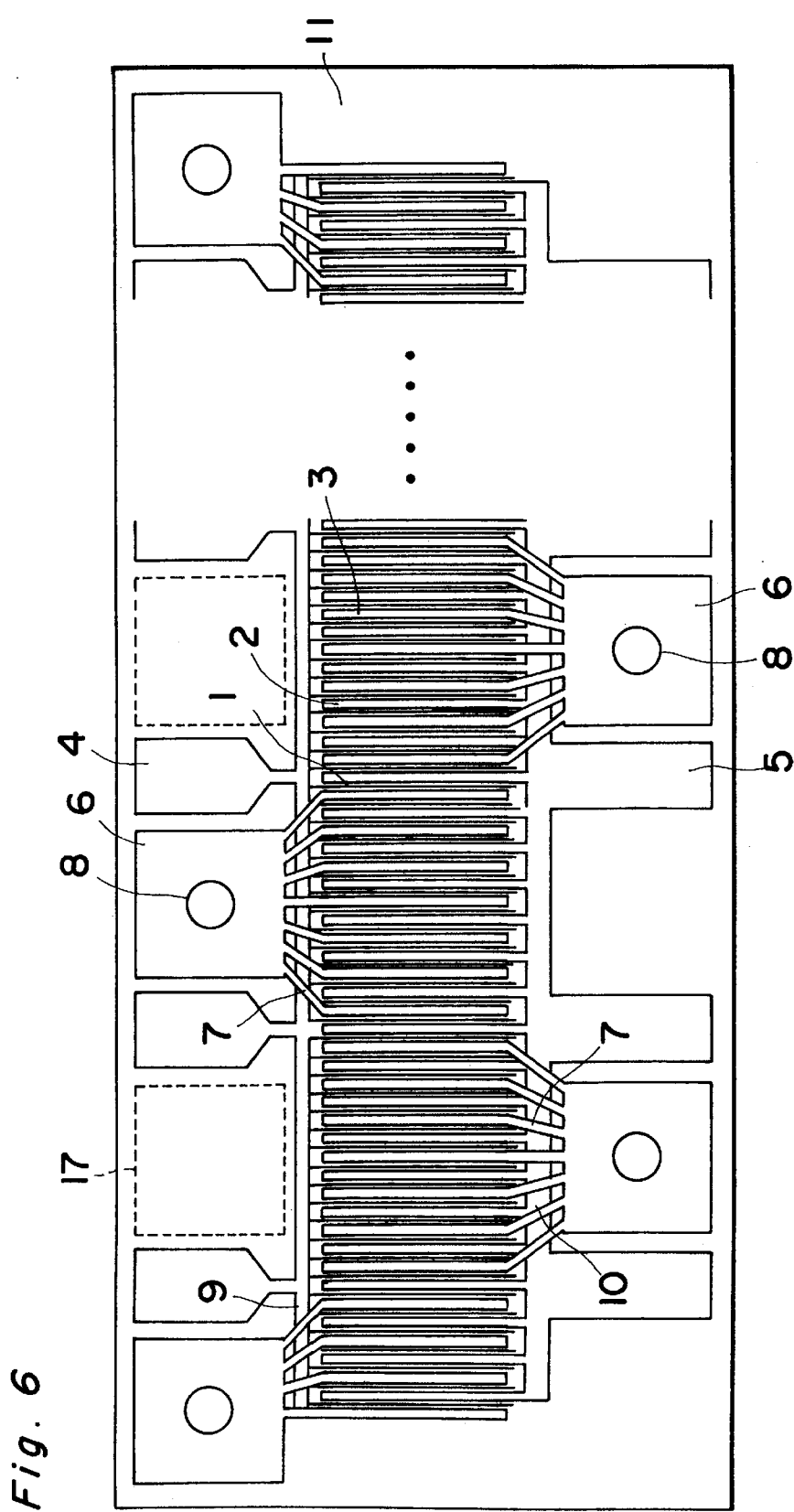
FIG. 6 is a plan view showing a semiconductor device according to a fifth embodiment of the present invention.

FIG. 6 is a plan view of a semiconductor device according to the fifth embodiment which is an advanced version of the first embodiment of the present invention for further higher performance. In the drawing, numerals identical to those of FIG. 1 denote identical or corresponding parts, and numeral 17 denotes a stub adjustment region.

While the first embodiment has the source pads 6 with the vias 8 connected thereto located on both the gate pad 4 side and the drain pad 5 side opposite each other with the active region between the fifth embodiment has the source pads on the gate side and the drain side in staggered arrangement as shown in FIG. 6.

Such a structure makes it possible to secure areas without a source pad 6 and areas with a source pad 6 alternatingly interposed between the gate pads 4, allowing the areas without a source pad 6 to be used as stub adjustment areas 17.

In an application in millimeter wave region where the operating frequency exceeds 20 GHz, stub adjustment can be made more accurately and easily through matching of the gate signal by forming a gate signal matching stub (not shown in drawing), which is separately installed outside the semiconductor device in the prior art, near the gate 1. Thus it is made possible to form the stub adjustment region 17 between the gate pads 4 without reducing the number of source pads 6, as shown in FIG. 6, allowing the stub adjustment region 17 to be formed beside the gate pad 4 without increasing the value of Ls, thereby effectively achieving the input signal matching near the gate.

Although in FIG. 6 no source pads are shown on the drain side regions opposite to the gate side source pads, it is possible to form the source pads on such regions.

Embodiment 6

Figure 7:
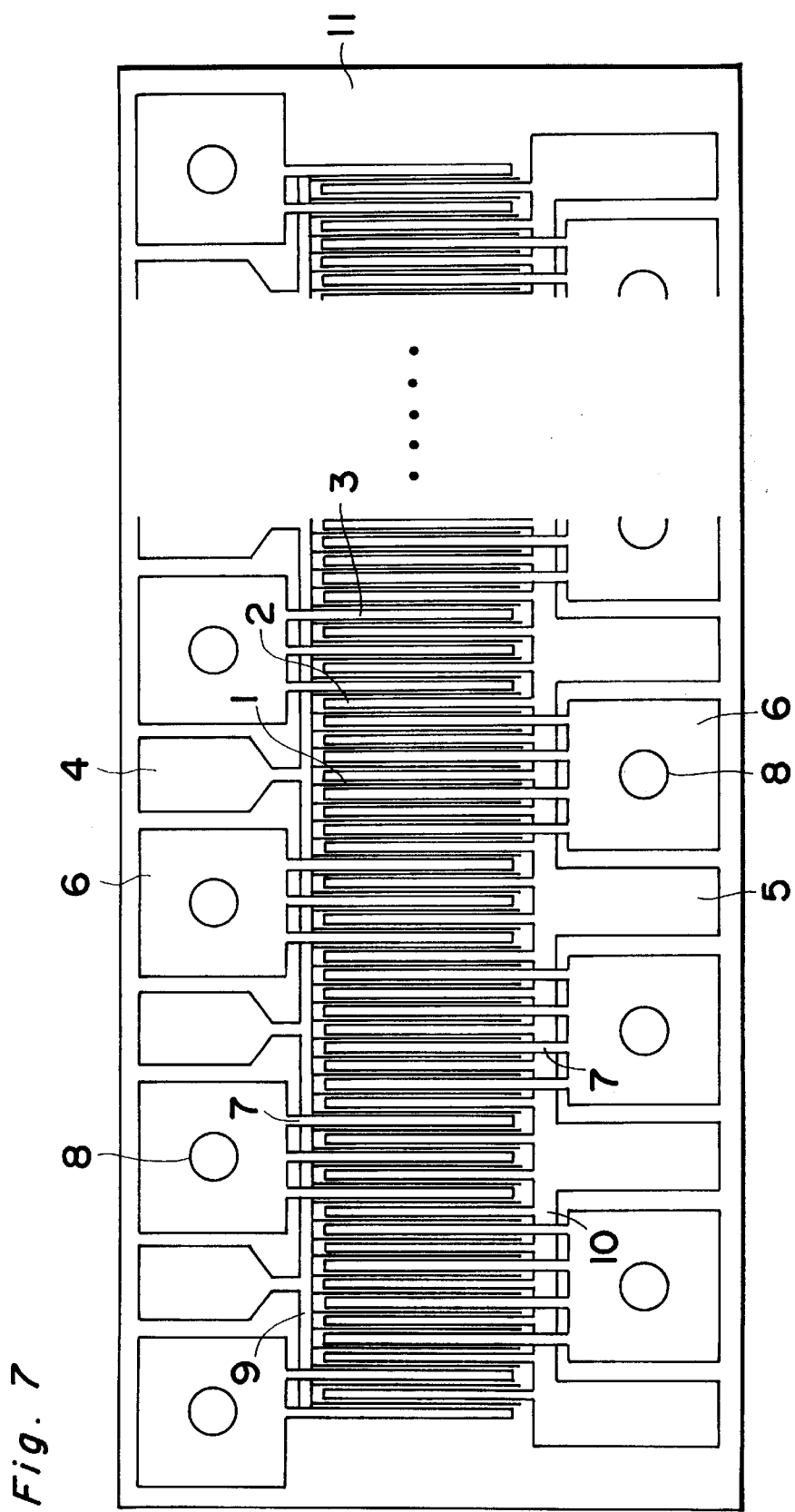
FIG. 7 is a plan view showing a semiconductor device according to a sixth embodiment of the present invention.

FIG. 7 is a plan view of a semiconductor device according to the sixth embodiment which is a further advanced version of the first embodiment of the present invention for higher performance. In the drawing, numerals identical to those of FIG. 1 denote identical or corresponding parts.

While the first embodiment has the source pads 6, located between the gate pads 4 and the drain pads 5 opposite each other interposing the active region, the sixth embodiment has the source pads formed in a staggered arrangement as shown in FIG. 7, so that the gate pad 4 and the drain side source pad 6 opposite each other and the drain pad 5 and the gate side source pad 6 opposite each other.

Such a structure allows the source air bridges 7, which cannot be arranged in parallel in the prior art shown in FIG. 9, to be arranged in parallel and accordingly to connect the source electrodes 3 and the source pads 6, making it possible to eliminate the variations in the value of Ls among the source electrodes 3 which have been caused by the difference in the length of the source electrodes 3.

Also because the drain pads 5 are located at such positions as oppose the source pad 6 that is located between one gate pad 3 and the next gate pad 3, the path length of the input signal from a point of being fed through the gate pad 4 to the point of being output from the drain pad 5 becomes the same for all gate electrodes 1, making it possible for all outputs to be in phase.

Thus this embodiment is, in addition to having the effect of reducing the value of Ls as in the first embodiment, capable of achieving a uniform Ls among the source and drain outputs that are all in phase.

Embodiment 7

Figure 8:
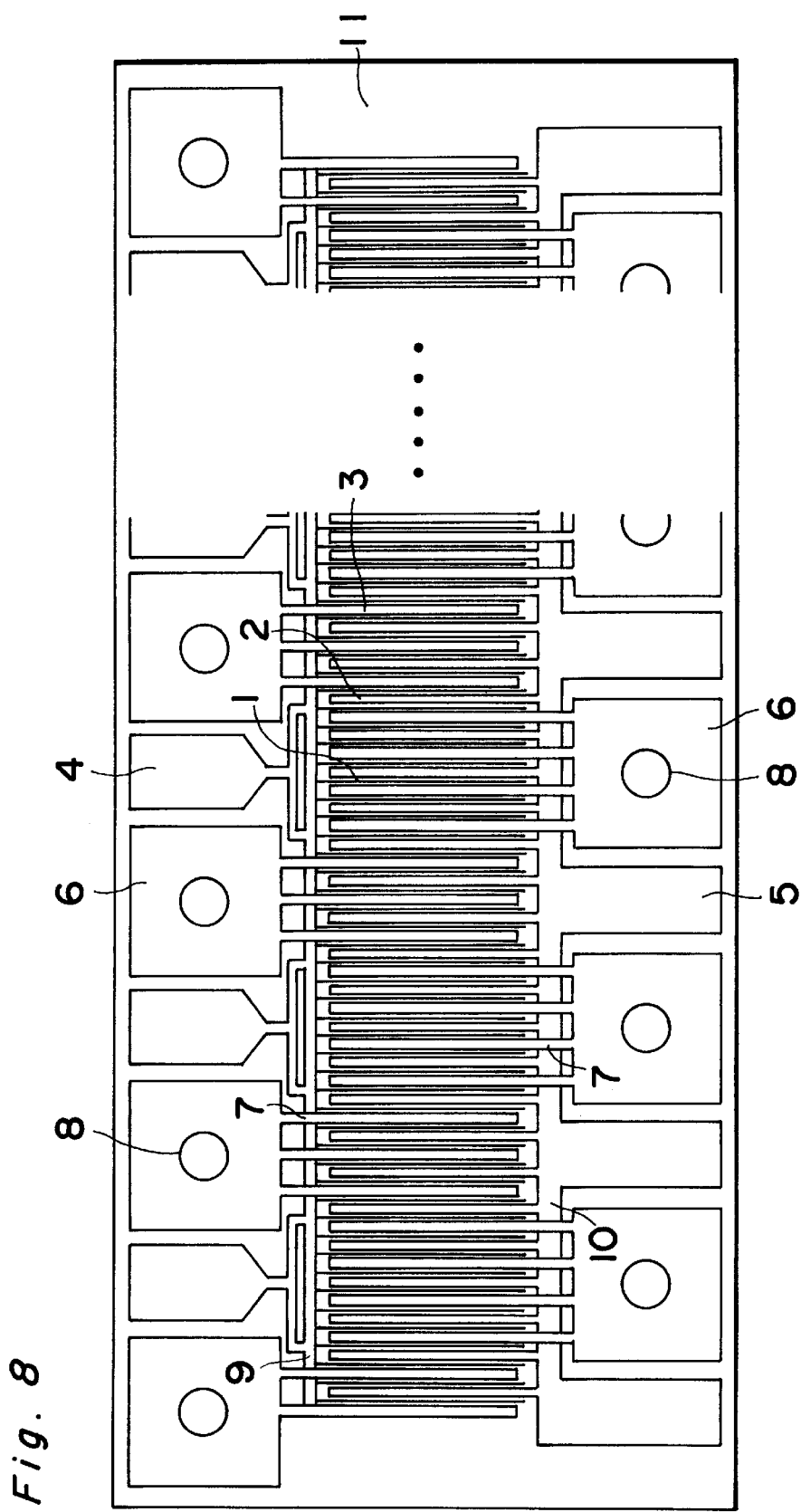
FIG. 8 is a plan view showing a semiconductor device according to a seventh embodiment of the present invention.

FIG. 8 is a plan view showing a semiconductor device according to the seventh embodiment which is a further advanced version of the first embodiment of the present invention for higher performance, similarly to the sixth embodiment. In the drawing, numerals identical to those of FIG. 1 denote identical or corresponding parts.

This embodiment provides a structure where an input signal from the gate pad 4 is divided into two parts which are distributed among the gate feeders as shown in FIG. 8.

Such a structure also makes the path length of the input signal from a point of being fed through the gate pad 4 to the point of being output from the drain pad 5 equal for all gate electrodes 1, making it possible for all outputs to be in phase.

According to the present invention, as will be apparent from the above description, it is possible to increase the number of source pads on the semiconductor device because the source pads are located also on the drain electrode side in an air-bridge structure crossing over the wiring that connects to the drain electrode, resulting in increased number of vias which are connected to the ground electrodes on the back side for each source pad, thereby making it possible to reduce the source inductance (Ls) and increase the maximum power gain (Gamax) of the semiconductor device.

By leading the gate pads and the drain pads to beyond the source pads, in particular, the number of the source pads to which the vias are connected can be increased further, thereby making it possible to achieve a high gain of the high-output FET during operation at high frequencies.

Also the inductance of the bonding wires can be reduced by providing an integrated gate pad and an integrated drain pad for dense connections of the bonding wires for connection to the outside, with the result of reduced inductance of the semiconductor device as a whole and improved maximum power gain (Gamax), thereby achieving higher performance of the high-output FET.

With the integrated gate pad structure, in particular, loop oscillation taking place in an RF input signal which is fed through the gate can be suppressed by integrating the gate pads while being electrically insulated.

Also according to the present invention, source electrodes of linear structure can be employed so that the semiconductor device having drain outputs in phase and a constant Ls from source to source can be achieved.

Also by dividing the input signal fed through the gate pad into two parts which are distributed among the gate feeders, path length for transmitting the input signal which is fed through the gate pad is made identical for all gate electrodes, thereby making it possible to put the outputs in phase.

Also according to the present invention, because areas without a source pad can be secured alternately with areas which include a source pad between the gate pads, the areas without a source pad can be used as the stub adjustment areas, thereby making it possible to match the input signal effectively in the vicinity of the gate.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed:

1. A semiconductor device comprising:

a semiconductor substrate having an active region and first and second external regions located on opposite sides of said active region, said active region having a multi-finger pattern including a plurality of gate electrodes, a plurality of source electrodes, and a plurality of drain electrodes, each of said plurality of gate electrodes being interposed between one of said source electrodes and one of said drain electrodes;

a plurality of gate pads disposed on said first external region and spaced apart from one another, each of said gate pads being connected to said plurality of gate electrodes;

a plurality of drain pads disposed on said second external region and spaced apart from one another, each of said drain pads being connected to said plurality of drain electrodes; and a plurality of grounded source pads disposed on said first and second external regions and spaced apart from one another, each of said plurality of source pads being electrically connected to said source electrodes.

2. The semiconductor device according to claim 1, wherein said plurality of gate pads are disposed beyond said plurality of source pads relative to said active region, each of said gate pads being connected to said plurality of gate electrode via a first wiring interposed between neighboring source pads, and wherein said plurality of drain pads are disposed beyond said plurality of source pads relative to said active region, each of said drain pads being connected to said plurality of drain electrodes via a second wiring interposed between neighboring pads.

3. The semiconductor device according to claim 2, wherein said plurality of gate pads are connected to one another in said first external region.

4. The semiconductor device according to claim 2, wherein said plurality of drain pads are connected to one another in said second external region.

5. The semiconductor device according to claim 3, including resistor regions wherein said plurality of gate pads are electrically connected to one another through said resistor regions.

6. The semiconductor device according to claim 1, wherein each of said plurality of gate pads is disposed between neighboring source pads, each of said plurality of drain pads is disposed between neighboring source pads, and each of said plurality of source electrodes is generally straight.

7. The semiconductor device according to claim 6, wherein each of said plurality of gate pads is connected via a plurality of first wirings to a second wiring disposed on said first external region and connected to said gate electrodes so that wiring lengths from each of said plurality of gate electrodes to said second wiring are substantially identical.

8. A semiconductor device comprising:

a semiconductor substrate having an active region and first and second external regions located on opposite sides of said active region, said active region having a multi-finger pattern including a plurality of gate electrodes, a plurality of source electrodes, and a plurality of drain electrodes, each of said plurality of gate electrodes being interposed between one of said source electrodes and one of said drain electrodes;

a plurality of gate pads disposed on said first external region and spaced apart from one another;

a plurality of drain pads disposed on said second external region and spaced apart from one another;

a plurality of stub adjustment regions, each stub adjustment region being interposed between neighboring gate pads; and a plurality of grounded source pads disposed on at least one of said first and second external regions so that each of said grounded source pads is interposed between neighboring gate or drain pads.

* * * * *